United States Patent
Alon et al.

(10) Patent No.: US 7,126,510 B2
(45) Date of Patent: Oct. 24, 2006

(54) CIRCUIT CALIBRATION SYSTEM AND METHOD

(75) Inventors: Elad Alon, Saratoga, CA (US); Bruno W. Garlepp, San Jose, CA (US); Vladimir Stojanovic, Stanford, CA (US); Andrew Ho, Palo Alto, CA (US); Fred F. Chen, San Francisco, CA (US)

(73) Assignee: Rambus Inc., Los Altos, CA (US)

(*) Notice: Subject to any disclaimer, the term of this patent is extended or adjusted under 35 U.S.C. 154(b) by 0 days.

(21) Appl. No.: 11/015,971

(22) Filed: Dec. 17, 2004

(65) Prior Publication Data

US 2006/0132339 A1    Jun. 22, 2006

(51) Int. Cl.
*H03M 1/10* (2006.01)

(52) U.S. Cl. ............... 341/120; 341/118; 341/152; 341/155

(58) Field of Classification Search ......... 341/118, 341/120, 155, 161–163
See application file for complete search history.

(56) References Cited

U.S. PATENT DOCUMENTS

| | | | | |
|---|---|---|---|---|
| 4,908,621 A | * | 3/1990 | Polonio et al. | 341/120 |
| 4,943,807 A | * | 7/1990 | Early et al. | 341/120 |
| 5,361,067 A | * | 11/1994 | Pinckley | 341/120 |
| 5,818,370 A | * | 10/1998 | Sooch et al. | 341/120 |
| 6,181,268 B1 | * | 1/2001 | Miyake et al. | 341/161 |
| 6,445,319 B1 | * | 9/2002 | Bugeja | 341/138 |
| 6,603,416 B1 | * | 8/2003 | Masenas et al. | 341/120 |
| 6,608,582 B1 | * | 8/2003 | Casper et al. | 341/155 |
| 2005/0197796 A1 | * | 9/2005 | Diagle et al. | 702/107 |

* cited by examiner

*Primary Examiner*—Rexford Barnie
*Assistant Examiner*—Khai Nguyen
(74) *Attorney, Agent, or Firm*—Morgan, Lewis & Bockius LLP

(57) ABSTRACT

An integrated circuit device includes one or more calibration paths including one or more devices. A signal generator is coupled to at least one calibration path and configured to provide the calibration path with a calibration signal having known characteristics. A controller is coupled to the signal generator and the calibration path and configured to adjust the signal generator and at least one parameter associated with at least one device in the calibration path.

33 Claims, 8 Drawing Sheets

_US 7,126,510 B2_

CIRCUIT CALIBRATION SYSTEM AND METHOD

TECHNICAL FIELD

The disclosed embodiments relate generally to circuit calibration systems and methods, and in particular to self-calibrating integrated circuits.

BACKGROUND

The performance of many integrated circuits (ICs) can be improved by using on-chip, self-calibration techniques. On-chip, self-calibration techniques are desirable because they typically do not consume expensive production time and can track physical changes in a system due to aging, temperature changes and the like. Moreover, self-calibration techniques can perform accurate calibration on-line in normal operating environments.

Applying on-chip, self-calibration techniques to ICs used in high-speed data communication applications is especially desirable due to the many sources of non-linearity and errors (e.g., offset, device mismatch, common-mode sensitivity, pre-amp gain compression, etc.). A typical high-speed data link receiver can include many receiver samplers for sampling data values (for example, in quadrature) and edges, and for adjusting equalization (i.e., adaptation) and testing data eye size. Each receiver sampler can include one or more digital-to-analog converters (DACs) for adjusting sampling threshold voltage levels and providing other functionality (e.g., adaptation and performance monitoring). Each of these DACs can be a source of errors, which, if uncompensated, could result in a degradation of the overall system performance. Performance degradations can include, without limitation, loss of voltage margins due to imperfect offset cancellations or threshold voltage settings and instability of adaptation algorithms, which, in part, rely on the overall system being linear (i.e., having a linear transfer function).

DESCRIPTION OF EMBODIMENTS

An integrated circuit device includes one or more calibration paths including one or more devices. A signal generator is coupled to at least one calibration path and configured to provide the calibration path with a calibration signal having known characteristics. A controller is coupled to the signal generator and the calibration path and configured to adjust the signal generator and at least one parameter associated with at least one device in the calibration path.

In some embodiments, the signal generator is an over-sampled DAC, including a digital pulse width modulator (PWM) coupled to an n-bit DAC and a low pass filter to provide an analog calibration signal of known characteristics. In an alternative embodiment, a single PWM can be used to provide digital waveforms to multiple DACs in a round-robin manner. In some embodiments, the calibration signal is multiplexed into the calibration path using pre-existing hardware structures in the integrated circuit device. In other embodiments, the multiplexing is accomplished using dedicated multiplexing circuitry.

In some embodiments, the integrated circuit device is a receiver for a high-speed communications link and the calibration path includes a sampler and a DAC for setting the sampling threshold voltage. In other embodiments, the self-calibration circuitry is included in a transmitter for a high-speed communications link to provide an accurate calibration signal to a receiver.

A significant advantage provided by the disclosed embodiments is the accurate compensation of nonlinearity and offset errors in an integrated circuit using simple and efficient self-calibration hardware, which can be implemented using standard semiconductor processes (e.g., CMOS). The efficient implementation of calibration hardware may increase a yield of accurate circuits across a wide variety of operating points. For example, high accuracy and linearity in a receiver is an enabler for complicated signal processing algorithms (e.g., adaptation, multi-level modulation, etc.).

Calibration System Overview

Figure 1:
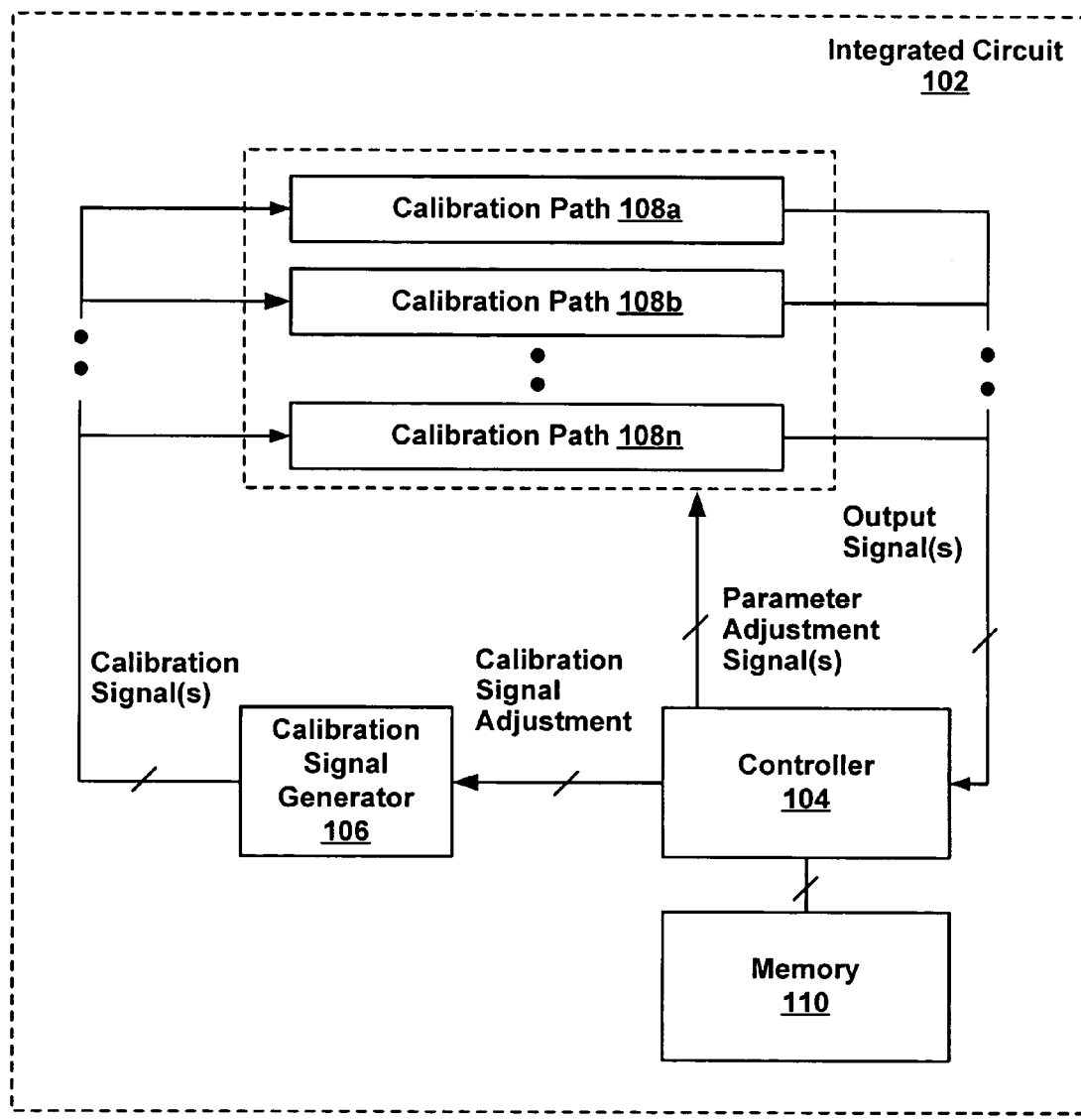
FIG. 1 is a block diagram of an embodiment of a circuit calibration system.

FIG. 1 is a block diagram of an embodiment of a circuit calibration system 100. The calibration system 100 generally includes an integrated circuit 102, a controller 104 and a calibration signal generator 106. The integrated circuit 102 includes one or more calibration paths 108a, . . . ,108n, which can include one or more devices to be calibrated. The calibration system 100 can be operated as part of an initialization procedure or during normal operation to compensate for errors attributed to device mismatch, aging, temperature changes and the like. An example of an integrated circuit 102 is a receiver for a high-speed data link. Such a receiver includes one or more calibration paths 108 (e.g., receiver "slices") including multiple devices (e.g., pre-amps, samplers, DACs). Typically, these devices are sources of non-linearity and offsets, which can reduce operating voltage margins and destabilize signal processing algorithms (e.g., adaptation) and make the circuit difficult to integrate with other links and circuits across a variety of operating points. Self-calibrating receiver systems for single-ended and differential signal paths are described with respect to FIGS. 2 and 3.

In some embodiments, the calibration signal generator 106 is configured to provide high quality analog representations of bits streams, which can be used to calibrate various parameters (e.g., threshold voltage levels) of devices (e.g., samplers) in the calibration paths 108. The calibration signals propagate through the calibration paths 108, resulting in output signals, which are sent to the controller 104. The controller 104 (e.g., a finite state machine) is configured to adjust the calibration signal generator 106 and at least one parameter associated with at least one device in the calibration paths 108 in response to the output signals, so as to calibrate one or more devices in the calibration paths 108. In some embodiments, the controller 104 is coupled to a memory device 110 for storing calibration parameters used to adjust the calibration signal generator 106 and device parameters in the calibration paths 108.

Self-Calibrating Receiver System (Single-Ended Signaling System)

Figure 2:
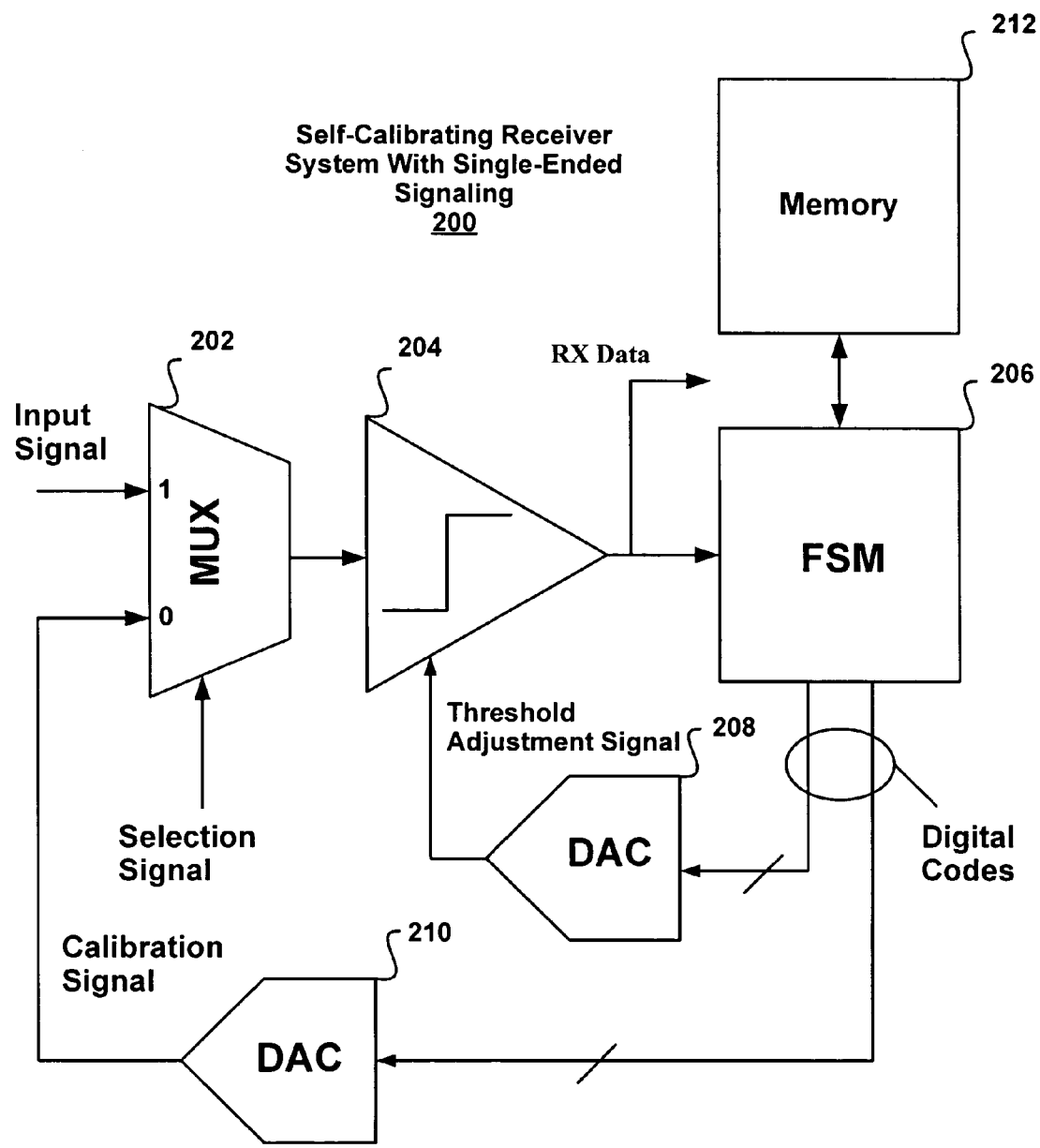
FIG. 2 is a block diagram of an embodiment of a receiver calibration system for use with a single-ended signaling system.

FIG. 2 is a block diagram of an embodiment of a self-calibrating receiver system 200 for use with a single-ended signaling system. In some embodiments, the receiver system 200 is a multi-sampler receiver coupled to an output driver transmitter via a high-speed signal path. The transmitter and receiver can be implemented in respective integrated circuit (IC) devices that are mounted on a common circuit board or different circuit boards (e.g., as in the case of backplane-mounted daughter boards). In alternative embodiments, IC dice (i.e., chips) containing the transmitter and receiver may be packaged within a single, multi-chip module with the chip-to-chip signaling path formed by bond wires or other signal conducting structures. Also, the transmitter and receiver may be formed on the same IC die (e.g., system on chip) and the signaling path implemented by a metal layer or other conducting structure of the die.

Note that a receiver system typically includes other circuits which are not shown in FIG. 2 but are well-known in the art. These additional circuits were excluded from FIG. 2 to simplify the description of the embodiment. For example, a receiver sampler will typically sample data signals in response to edges (rising and/or falling) of a sampling clock. The sampling clock may be supplied to the receiver via an external clock line, or may be a multiplied version of a reference clock (e.g., recovered by a delay-locked loop or phase-locked loop circuit). In other embodiments, the sampling clock signal may be recovered from the incoming data signal itself by a clock data recovery (CDR) circuit.

The receiver system 200 includes a multiplexer 202, a data sampler 204, a finite state machine (FSM) 206, an n-bit voltage threshold adjustment DAC 208 (e.g., 9 bits), an oversampled DAC 210 and memory 212. The receiver system 200 is not limited to the configuration shown and can include more or fewer samplers, and other implementations of FSMs and DACs, as well as other types of circuits typically found in a receiver, such as pre-amplifier(s) preceding the sampler(s). The receiver system 200 is capable of operating in at least two modes: normal mode and calibration mode. In some embodiments, the modes are determined by the FSM 206, which generates a selection signal indicative of the mode of operation based on a predetermined pattern of input signals (e.g., a high frequency pattern such as 10101). In other embodiments, the selection signal is generated external to the receiver system 200 or by other control logic in the receiver system 200.

The multiplexer 202 receives the selection signal and couples either an input signal or an analog calibration signal to the data sampler 204 based on the selection signal (e.g., logic '1'=normal mode, logic '0'=calibration mode). In some embodiments, the input signal is a level-encoded (e.g., multi-PAM) signal received from a single-ended signal path (i.e., a single conductor path). In other embodiments, the input signal is a differential signal received from a differential signal path having a pair of component signal lines to conduct differential signals generated by a transmitter, as described with respect to FIG. 3.

Normal Mode

When the receiver is in normal operation mode, the multiplexer 202 couples the input signal to the data sampler 204 in response to a selection signal. The data sampler 204 samples the input signal and generates a data sample having a logic '1' or '0' state according to whether the input signal exceeds a variable voltage threshold. In some embodiments, the voltage threshold is generated by the DAC 208. In other embodiments, the threshold voltage is generated by a voltage divider or other circuit and set to a point midway between steady-state high and steady-state low signaling levels. Based on one or more sampled data values, the FSM 206 generates one or more digital codes, which are converted into a threshold adjustment signal by the DAC 208. The DAC 208 adjusts the voltage threshold of the sampler 204 with the threshold adjustment signal (e.g., so as to cancel any offset error associated with the data sampler 204). In some embodiments, the digital codes provided to the DAC 208 are retrieved from memory 212. The digital codes may be determined during the calibration mode, described below, and then stored in memory 212.

Calibration Mode

The receiver system 200 can be operated in a calibration mode as part of an initialization procedure or during normal operation to compensate for errors attributed to aging, temperature changes and the like. In some embodiments, the multiplexer 202 couples a calibration signal generated by a DAC 210 (e.g., an oversampled DAC) to the data sampler 204 in response to a selection signal. The data sampler 204 generates sampled values of the calibration signal, which are provided to the FSM 206. Based on one or more sampled values, the FSM 206 provides one or more digital codes, which are converted into threshold adjustment voltages by the DAC 208. The DAC 208 adjusts the variable voltage threshold of the data sampler 204 with the threshold adjustment signal so as to cancel any DC offset or non-linearity. Thus, a negative feedback loop is created in which the data sampler 204 is adjusted to drive the DC offset to a target DC offset point. The FSM 206 is also configured to provide digital codes to the oversampled DAC 210 for adjusting the calibration signal. These digital codes can be designed to control the DAC 210 so as to provide calibration signals having different values. When the offset is reduced to a predetermined level, the digital codes which generate voltage thresholds corresponding to the target DC offset point are stored in memory 212 for use in normal mode. This process can then be repeated for other target DC offset/voltage threshold points.

Note that the embodiment described above is readily adaptable to various types of receivers, including without limitation sampling receivers and integrating receivers, and data, edge and adaptive samplers.

Receiver Calibration System (Differential Signaling System)

Figure 3:
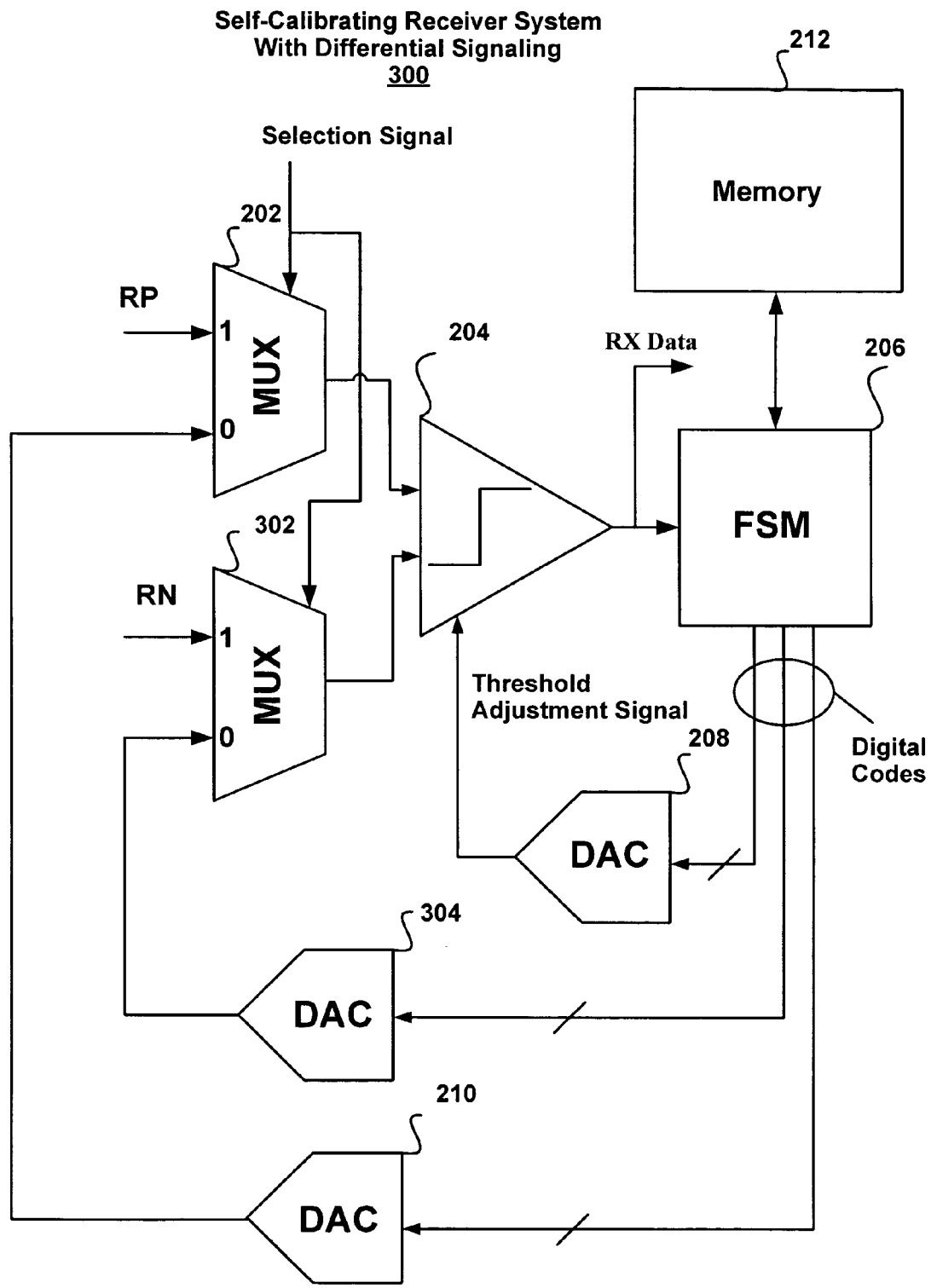
FIG. 3 is a block diagram of an embodiment of a receiver calibration system for use with a differential signaling system.

FIG. 3 is a block diagram of an embodiment of a self-calibrating receiver system 300 for use with a differential signaling system. The receiver system 300 includes elements of the receiver system 200 and additionally includes a second multiplexer 302 and a second calibration signal generator 304 (e.g., an oversampled DAC). In a differential signaling system, the common mode of the incoming differential signal may constitute a zero reference so that if the signal level on the positive signal line RP exceeds the signal level on the negative signal line (RN), a logic '1' is captured by the data sampler 204 and, conversely, if the signal level on the negative signal line exceeds the signal level on the positive signal line, a logic '0' is captured by the data sampler 204. Thus, the data sample provided by the data sampler 204 has a logic state that corresponds to the sign of the incoming data signal, positive or negative.

In differential signaling systems it is often desirable to implement differential amplifier circuitry with a controllable input offset voltage. Such differential amplifier circuitry typically requires a differential voltage applied at its inputs equal to the input offset voltage to produce a zero differential voltage at its outputs. This differential input voltage is termed the "twist voltage." The value of the twist voltage should be controllable, preferably through a substantially linear transfer function. In some embodiments, the threshold voltage adjustment DAC 208 along with twistable differential amplifiers provide this functionality. An example application for such differential amplifier circuitry is in a differential 4-level pulse amplitude modulation (4-PAM) signal receiver, where twistable differential amplifiers can serve as preamplifiers for feeding the additional samplers required to properly decode 4PAM symbols. This enables samplers with zero differential voltage thresholds to be used for sampling at the centers of the lower and upper eyes. Alternatively, samplers with non-zero thresholds that are not at the centers of the lower and upper eyes may be used. Such samplers may select thresholds adaptively.

The positive and negative signal lines RP and RN are coupled to the data sampler 204 via multiplexers 202 and 302, respectively. Also, coupled to the multiplexers 202 and 302 are oversampled DACs 210 and 304, respectively, for providing calibration signals. During calibration, the multiplexers 202 and 302 couple the outputs of the oversampled DACs 210 and 304 to the data sampler 204 in response to a selection signal. The data sampler 204 provides data samples to the FSM 206, which uses the data samples to determine an offset cancellation value. For example, a steady-state positive or negative output from the data sampler 204 in response to a null data calibration signal from the oversampled DACs 210 and 304 (i.e., the calibration signal levels impressed on component lines of the differential signal path have the same levels) indicates a DC error within the data sampler 204. The FSM 206 receives the error indication (e.g., a data sign value) and generates a digital code, which is converted by the DAC 208 to provide an analog threshold adjustment signal. The analog threshold adjustment signal is applied within the data sampler 204 to bias the data sampler 204 in a direction counter to the DC offset so as to cancel the offset error. Thus, a negative feedback loop is created in which the data sampler 204 is adjusted to drive the DC offset to a target value (e.g., zero). This process can then be repeated for other target voltage threshold (e.g., twist) values. Once the calibration process is complete (e.g., the DC offset is driven to the target value), the FSM 206 will provide the multiplexers 202 and 302 with a selection signal that reconfigures the multiplexers 202 and 302 to couple the positive and negative inputs signals RP and RN to the data sampler 204 and, thus, commence the normal operation mode for the system 300. In some embodiments, the memory 212 stores values for the DAC 208 which provide a mapping from desired code or offset values to the actual DAC code required. In some embodiments, DACs 210 and 304 may be implemented by a single differential-output DAC.

Calibration Signal Generators

Figure 4:
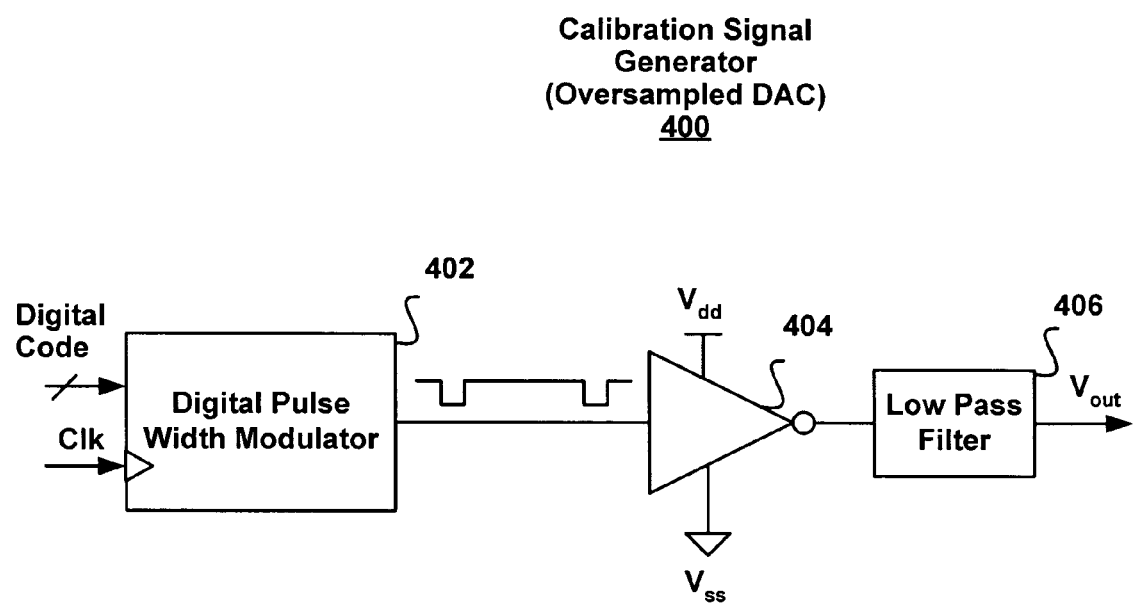
FIG. 4 is a block diagram of an embodiment of a calibration signal generator.

FIG. 4 is a block diagram of an embodiment of a calibration signal generator 400. The calibration signal generator 400 shown in FIG. 4 is an oversampled DAC, which includes a digital pulse width modulator (PWM) 402, an inverter 404 and a low pass filter 406. The PWM 402 produces a digital waveform having a duty cycle determined by the digital code (e.g., provided by FSM 206 shown in FIGS. 2 and 3). The digital output waveform is converted by a 1-bit DAC 404 (e.g., an inverter logic device) into an analog voltage waveform. The analog voltage waveform is then averaged by the low pass filter 406 to produce a calibration signal suitable for on-chip calibration. In some embodiments, the low pass filter 406 is a single resistor-capacitor (RC) network. In other embodiments, the low pass filter 406 is a multi-stage RC filter, wherein the components (resistors, capacitors) are selected to minimize ripple in the output voltage. An RC filter within the low pass filter 406 may include a resistive element (e.g., a polysilicon resistor) coupled to a shunt capacitance (e.g., non-leaky capacitor). Such an RC filter is well-suited for generating on-chip calibration signals because any component mismatch or other variation will only affect the cut-off frequency of the RC filter and not the overall accuracy of the calibration signal generator 400. While an RC filter provides a suitable calibration signal, other circuit topologies for the low pass filter 406 can be used as well, provided such circuit topologies result in the filter having a linear transfer function.

Note that other embodiments of the calibration signal generator 400 can be used to source on-chip calibration signals. For example, the digital PWM 402 could be replaced with a digital interpolation filter coupled to a sigma-delta modulator circuit. The digital interpolation filter is configured to insert zeros in a digital input data stream to increase the number of words in a given time period (i.e., over-sampling), thus increasing the effective sampling rate. The resulting over-sampled waveform can then be processed by the sigma-delta modulator circuit, which produces a 1-bit digital data stream that can then be decoded by the 1-bit DAC 404 and filtered by the low pass filter 406 as is well-known in the art. By increasing the effective sampling rate, the noise power associated with the 1-bit DAC (e.g., quantization error) will be distributed over the entire sampling bandwidth, resulting in a reduction of noise power in the signal band. The calibration signal generator 400 can be used with a single-ended or differential signaling system. In a differential signaling system, however, an additional calibration signal is needed to provide differential calibration voltages. Alternatively, by replacing inverter 404 with a differential 1-bit DAC and filter 406 with a differential low pass filter, a differential signal generator 400 will be enabled.

Figure 5:
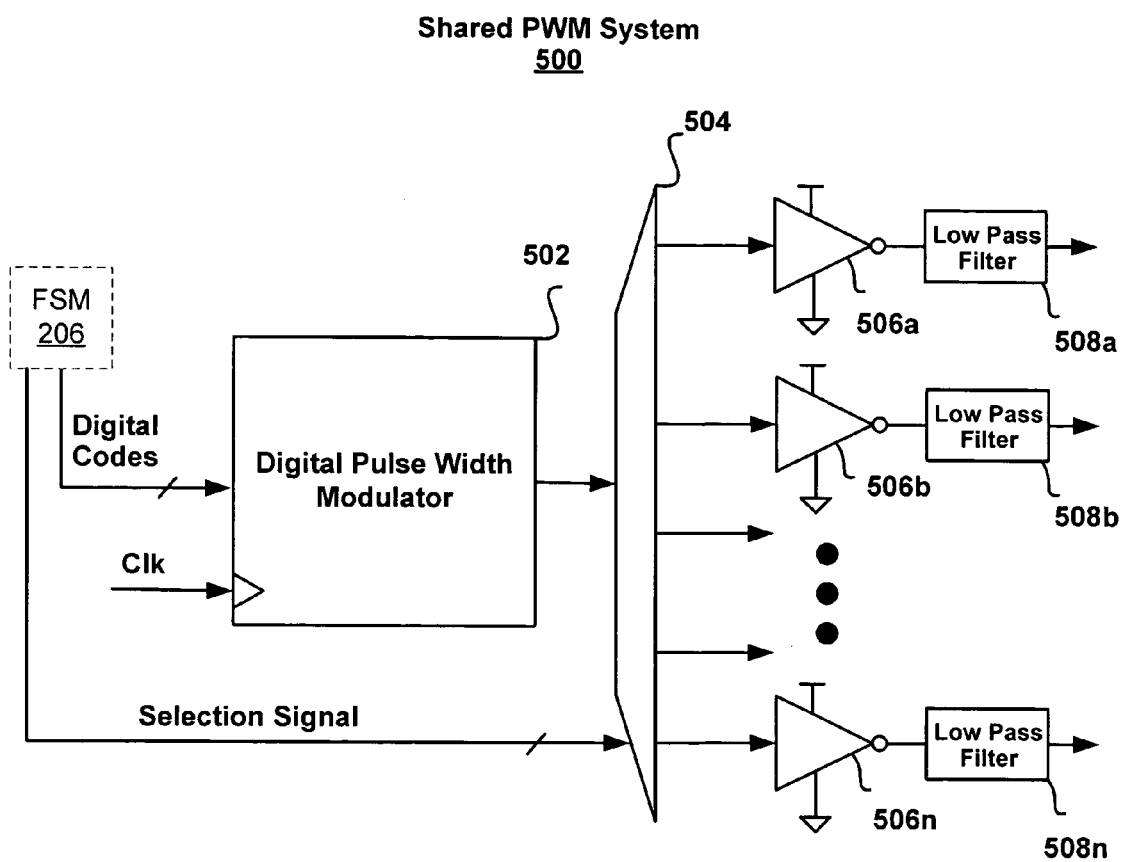
FIG. 5 is a block diagram of an embodiment of a shared PWM system.

FIG. 5 is a block diagram of an embodiment of a shared PWM system 500. The shared PWM system 500 includes a digital PWM 502, a selection circuit 504 (e.g., a 1:n demultiplexer), 1-bit DACs 506 (e.g., inverters) and low pass filters 508 (e.g., RC filters). The selection circuit 504 may have latches to hold one or more inputs to one or more of the DACs 506. Outputs from the selection circuit 504 may also use tri-state logic. To increase chip area/power efficiency, the output of the PWM 502 can be shared between multiple DACs 506 in a round-robin manner. During calibration mode, the PWM 502 produces digital waveforms in response to Digital Codes (e.g., a sequence of Digital Codes 1, . . . , N), which are coupled to corresponding DACs 506a, . . . ,506n. The selection circuit 504 couples the digital waveform to its corresponding DAC 506 in response to a selection signal (e.g., one or more signals provided by the FSM 206 shown in FIGS. 2 and 3). The selection signals and Digital Codes are transmitted by the FSM 206 to the shared PWM system 500 in a coordinated fashion so as to support the round-robin mode of operation of the shared PWM system 500. In response to Digital Code 1, the PWM 502 generates a digital waveform, which is coupled by selection circuit 504 to DAC 506a. The DAC 506a converts the digital waveform into an analog waveform, which is filtered by the low pass filter 508a into an analog calibration signal used to calibrate the calibration path driven by the output of low pass filter 508a. Next, the PWM 502 generates a digital waveform in response to a Digital Code 2. The digital waveform is coupled by selection circuit 504 to DAC 506b, where it is converted into an analog waveform. The analog waveform is filtered by the low pass filter 508b into an analog calibration signal used to calibrate the calibration path driven by the output of low pass filter 508b. This process continues in a round-robin manner during calibration mode until the nth Digital Code has been processed, and then repeats, going back to Code 1.

Note that by sharing a single PWM 502 as described above the amount of circuitry for calibration is reduced.

Figure 6A:
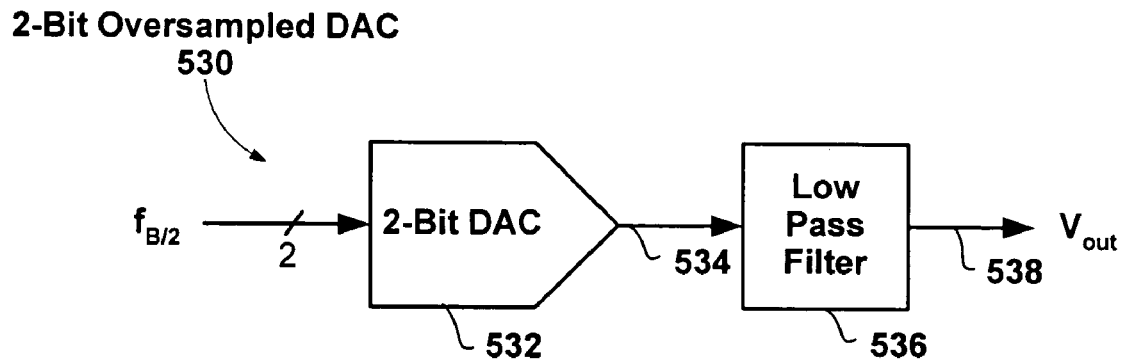
FIG. 6A is a block diagram of a 2-bit oversampled DAC.

FIG. 6A represents a 2-bit oversampled DAC, which can be used to replace one of the 1-bit DACs 506 and low pass filters 508 (FIG. 5) when the rate of the PWM 502 is not well above the cut-off frequency. Similarly, referring to FIG. 4, an n-bit DAC (where n is an integer greater than 1) such as the 2-bit DAC of FIG. 6A, can be used to replace the inverter 404 of the calibration signal generator 400 when the rate of the PWM 402 is not well above the cut-off frequency. The 2-bit oversampled DAC 530 of FIG. 6A includes a 2-bit DAC 532, which is driven by a signal $f_{B/2}$ comprising a stream of 2-bit values. The 2-bit DAC 532 outputs a voltage on node 534 corresponding to the 2-bit value at the DAC's input. The time varying voltage on node 534 is averaged by a low pass filter 536, with the resulting output signal Vout being produced on node 538. In other embodiments, the DAC 532 may be an n-bit DAC, where n is an integer greater than 1, and the signal driving the n-bit DAC comprises a stream of n-bit values.

Figure 6B:
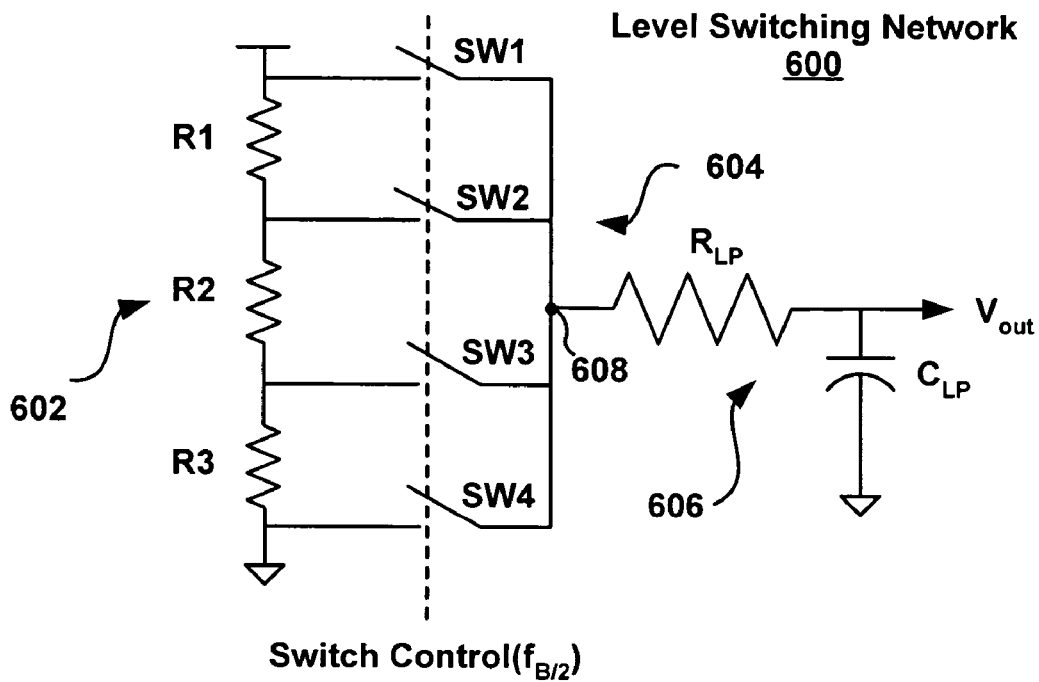
FIG. 6B is a block diagram of a level switching network for implementing a 2-bit oversampled DAC.

FIG. 6B is a block diagram of an embodiment of a level switching network 600 that can be used to implement a 2-bit DAC. A level switching network 600 can replace each DAC 506 in the shared PWM system 500 in FIG. 5 or it can replace the inverter 404 of the calibration signal generator 400 in FIG. 4. In some embodiments, the level switching network 600 includes a resistive ladder network 602 including three or more resistors (R1, R2, R3, . . . ), depending upon the number of voltage levels desired. In the embodiment shown in FIG. 6B, the number of voltage levels is four, and in some other embodiments the number of voltage levels will be $2^n$, where n is an integer greater than 1. The values of the one or more resistors in the resistive ladder network 602 are selected to provide a desired voltage at the input to each of the switches 604. To generate an output signal Vout having a particular steady state voltage, the switches 604 are opened and closed over a sequence of time periods in accordance with a switch control signal. In a typical implementation, only one of the switches 604 is closed during each time period, with the closed switch being identified by an n-bit digital code. The switches 604 couple the voltages from the resistive ladder network 602 to a low pass filter 606 (represented here by resistor $R_{LP}$ and capacitor $C_{LP}$), which operates as previously described with respect to FIG. 4. In some embodiments, the switches 604 are controlled by a sequence of digital codes, each digital code indicating one of the switches to be closed. The sequence of digital codes comprise the "switch control" signal shown in FIG. 6B. By using the digital codes to control the relative amount of time that each of the switches is closed, the average voltage level at node 608, and thus the output voltage Vout, may be controlled with a high degree of precision. A unity gain buffer circuit may be used at node 608 to isolate the resistor ladder from the LPF 606.

Multiplexing Implementations

Note that some existing hardware structures typically used in receivers and transmitters can be exploited to provide an efficient implementation of the multiplexing functionality described in FIGS. 2, 3 and 5. Exemplary embodiments of multiplexing systems that exploit pre-existing hardware structures are described with respect to FIGS. 7–9.

Pre-Amplifier Multiplexing System

Figure 7:
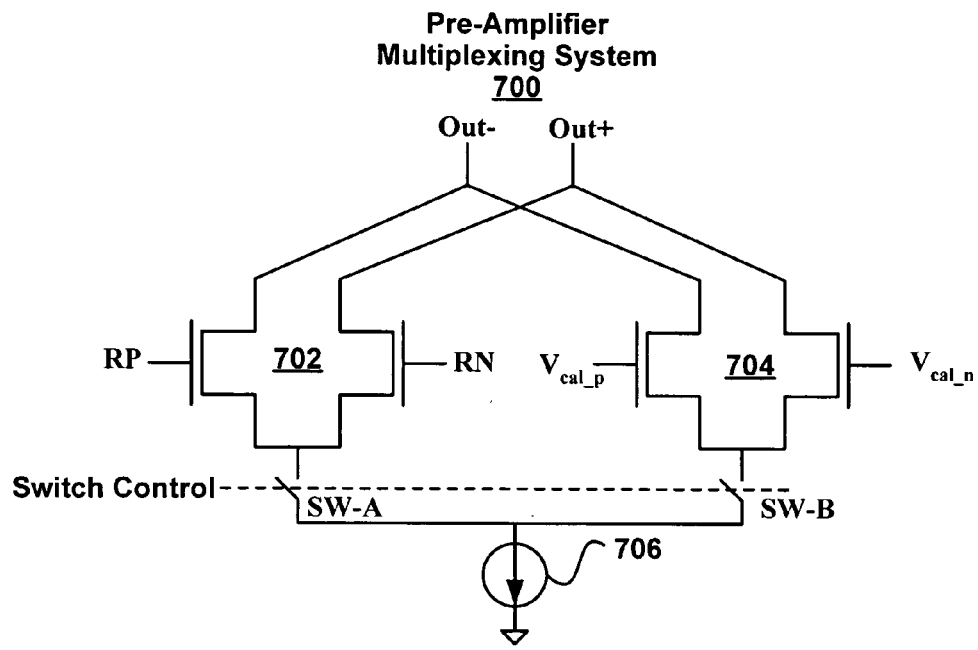
FIG. 7 is a block diagram of an embodiment of a pre-amplifier multiplexing system.

FIG. 7 is a block diagram of an embodiment of a pre-amplifier multiplexing system 700. Receivers used in high-speed data links are typically preceded by pre-amplifiers, which include hardware that can be used to efficiently implement the multiplexers 202 and 302. In some embodiments, the pre-amplifier multiplexing system 700 includes a differential pair 702 for receiving differential voltage levels RP and RN and a differential pair 704 for receiving calibration voltage levels $V_{cal\_p}$ and $V_{cal\_n}$. The differential pair 702 is coupled to a current source 706 via switch SW-A and the differential pair 704 is coupled to the current source 706 via switch SW2. During calibration mode, SW-A is commanded OPEN and SW-B is commanded CLOSED by switch control signals. During normal mode, SW-A is commanded CLOSED and SW-B is commanded OPEN by the switch control signals. In some embodiments, the switch control signals are generated by a FSM (e.g., FSM 206) or other control circuitry. Note that the differential pairs 702 and 704 are preferably well-matched to reduce residual offset errors.

Receiver Multiplexing System

Figure 8:
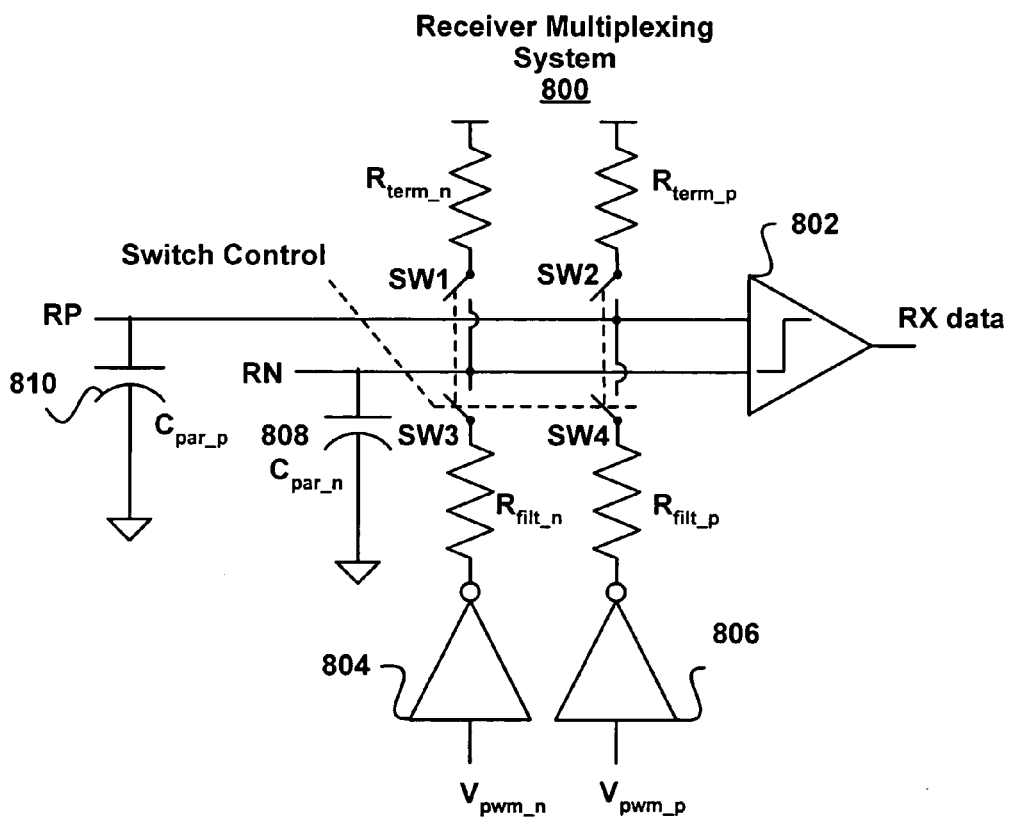
FIG. 8 is a block diagram of an embodiment of a receiver multiplexing system.

FIG. 8 is a block diagram of an embodiment of a receiver multiplexing system 800. The receiver multiplexing system 800 includes a data sampler 802 and inverters 804 and 806. During normal operation, the switches SW1 and SW2 are commanded CLOSED and the switches SW3 and SW4 are commanded OPEN by one or more switch control signals. Note that in some embodiments switches SW3 and SW4 may be eliminated and an output of the inverters 804 and 806 may be set to a high impedance during normal operation using tri-state logic. When switches SW1 and SW2 are in a CLOSED state and switches SW3 and SW4 are in an OPEN state, the differential signals RP and RN are terminated by resistors $R_{term\_p}$ and $R_{term\_n}$, respectively, and the inverters 804 and 806 are disconnected. During calibration mode, the switches SW1 and SW2 are commanded OPEN and the switches SW3 and SW4 are commanded CLOSED by the switch control signals. When switches SW1 and SW2 are in an OPEN state and switches SW3 and SW4 are in a CLOSED state, the inverters 804 and 806 are coupled to the differential signals RP and RN and the termination resistors $R_{term\_p}$ and $R_{term\_n}$ are disconnected. The inverters 804 and 806 function as 1-bit DACs and convert differential digital waveforms from digital PWM waveforms to analog waveforms, as previously described with respect to FIG. 4. The filter resistors $R_{filt\_p}$ and $R_{filt\_n}$ coupled to shunt parasitic capacitances 808 and 810 ($C_{par\_p}$, $C_{par\_n}$) of the differential signal paths to form low pass filters (i.e., RC filters). The low pass filters extract the average voltages from the analog waveforms to provide positive and negative calibration signals for the data sampler 802. Note that the resistor terminations in the transmitter are preferably disabled in a similar manner to ensure proper operation of the circuit. The values of filter resistors $R_{filt\_p}$ and $R_{filt\_n}$ are preferably large (e.g., 10 to 500K ohms) so that when they are combined with the parasitic line capacitances (typically 1 pF), the low pass filters will have the desired characteristics.

While the multiplexing implementations described with respect to FIGS. 7 and 8 provide the desired multiplexing function using minimum hardware, these implementations could result in different input voltage characteristics (e.g., different differential pair with different input offset or different impedance seen by the receiver input) during calibration and normal modes. This result can be avoided by calibrating the input/output transfer function of the transmitter so as to provide accurate voltage at the inputs of the receiver, as described with respect to FIG. 9.

Transmitter Multiplexing System

Figure 9:
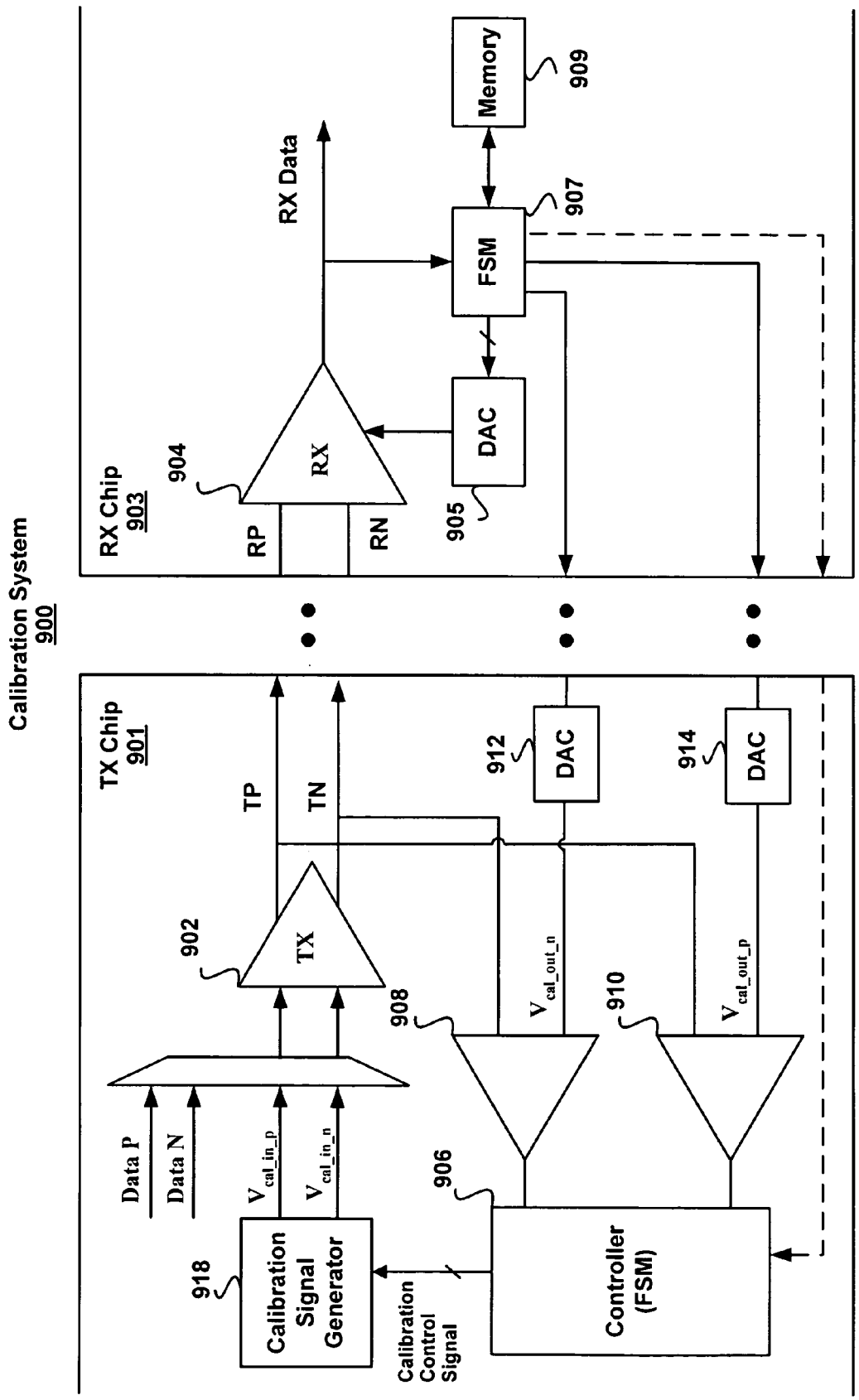
FIG. 9 is a block diagram of an embodiment of a transmitter multiplexing system.

FIG. 9 is a block diagram of an embodiment of a transmitter multiplexing system 900. The transmitter multiplexing system 900 includes a transmitting device 901 (e.g., a first integrated circuit) and a receiving device 903 (e.g., a second integrated circuit). The transmitting device 901 has a transmitter 902, a calibration controller (e.g., a FSM) 906, data samplers 908 and 910, DACs 912 and 914, and a calibration signal generator 918. The differential output signals TP and TN of the transmitter 902 are sampled by the data samplers 908 and 910, respectively. The output signals TP and TN are compared against threshold voltages $V_{cal\_out\_p}$ and $V_{cal\_out\_n}$, respectively, which are generated by the DACs 912 and 914. The results of the comparisons are received by the controller 906, which is configured to provide a calibration control signal for adjusting the calibration signal generator 918. In some embodiments, the calibration signal generator 918 is an oversampled DAC, as previously described with respect to FIG. 4.

The receiving device 903 includes a data sampler 904, an offset cancellation DAC 905, a FSM/controller 907, and a memory 909. The calibration process is controlled by the FSM 907 in the receiver, with the transmitter device 901 acting as a slave to the receiving device 903 during the calibration process. The following is an explanation of one method of utilizing the system shown in FIG. 9 to calibrate both the transmitter and receiver.

Initially, all the DACs 905, 912, 194 are set to a predefined state, for example the state corresponding to control values of zero, thereby providing substantially zero offset values to the data samplers 904, 908 and 910. In the transmitter device 901, if TP is unequal to TN, the controller 906 adjusts the calibration signals $V_{cal\_in\_p}$ and $V_{cal\_in\_n}$ produced by the calibration signal generator 918 until TP=TN.

Next, the FSM 907 adjusts offset DAC 905 so that data sampler 904 is operating at a switch point voltage (e.g., at the analog switch point corresponding to the dividing point between two digital values). More specifically, the FSM 907 sends commands or control values to the offset DACs 912, 914 so as to generate a voltage difference between TP and TN that is equal to the switch point voltage, and then adjusts the receiver's offset DAC 905 until the RX data signal switches back and forth between two values when small changes are made in the offset voltage produced by the receiver offset DAC 905. The DAC control code used by the FSM to produce this result with the receiver offset DAC 905 is then stored in memory 909 in an entry corresponding to the switch point voltage. If the receiver device has more than one switch point voltage, this process is repeated for each switch point voltage until all the DAC control codes corresponding to all the switch point voltages have been stored in memory 909. This methodology can also be used to calibrate multiple parallel data samplers in a receiver device, each having one or more respective switch point voltages. When the system is operated in normal operating mode, the transmitting device's calibration controller 906, data samplers 908, 910 and the calibration signal generator 918 are powered down or otherwise not used. In some embodiments, the receiving device's FSM 907 sends commands to the transmitting device's calibration controller 906 (or vice versa) to coordinate the calibration process by the two devices 901 and 903.

If the input/output transfer function of the transmitter is calibrated as described above, the transmitter can be used to provide an accurate voltage at the receiver, thus obviating the need for a calibration signal generator at the receiver. If the system is a multi-transmitter/receiver system, then one or more communication links can be established between the transmitters and receivers to ensure that the transmitters calibrate their corresponding receivers.

Devices and circuits described herein can be implemented using computer aided design tools available in the art, and embodied by computer readable files containing software descriptions of such circuits, at behavioral, register transfer, logic component, transistor and layout geometry level descriptions stored on storage media or communicated by carrier waves. Data formats in which such descriptions can be implemented include, but are not limited to, formats supporting behavioral languages like C, formats supporting register transfer level RTL languages like Verilog and VHDL, and formats supporting geometry description languages like GDSII, GDSIII, GDSIV, CIF, MEBES and other suitable formats and languages. Data transfers of such files on machine readable media including carrier waves can be done electronically over the diverse media on the Internet or through email, for example. Physical files can be implemented on machine readable media such as 4 mm magnetic tape, 8 mm magnetic tape, 3½ inch floppy media, CDs, DVDs and so on.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. An integrated circuit, comprising:
   a calibration path including a device;
   a signal generator, comprising an oversampled n-bit digital-to-analog converter (DAC), coupled to the calibration path and to provide the calibration path with an adjustable calibration signal; and a controller coupled to the signal generator and the calibration path, the controller is to adjust the signal generator and a parameter associated with the device in the calibration path in response to an output signal provided by the integrated circuit so as to calibrate the device in the calibration path;

wherein the oversampled n-bit DAC comprises:

a digital pulse width modulator (PWM) to generate a digital waveform; and the oversampled n-bit DAC provides an analog calibration signal in accordance with the digital waveform, and wherein the adjustable calibration signal derived from the analog calibration signal is a DC reference voltage.

2. The integrated circuit of claim 1, wherein the oversampled DAC, further comprises:

an analog filter coupled to the oversampled n-bit DAC is to provide a filtered analog calibration signal.

3. The integrated circuit of claim 2, wherein the analog filter is a low pass filter.

4. The integrated circuit of claim 3, wherein the low pass filter is a resistor-capacitor (RC) filter.

5. The integrated circuit of claim 1, wherein the digital waveform has a duty cycle determined by a digital code.

6. An integrated circuit, comprising:

a calibration path including a device;

a signal generator, comprising an oversampled digital-to-analog converter (DAC), coupled to the calibration path and to provide the calibration path with an adjustable calibration signal; and a controller coupled to the signal generator and the calibration path, the controller is to adjust the signal generator and a parameter associated with the device in the calibration path in response to an output signal provided by the integrated circuit so as to calibrate the device in the calibration path;

wherein the oversampled DAC, comprises:

a digital pulse width modulator (PWM) to generate a digital waveform; and the oversampled DAC provides the adjustable calibration signal in accordance with the digital waveform, and wherein the adjustable calibration signal is a DC reference voltage.

7. The integrated circuit of claim 6, further comprising:

a switch coupled to the PWM, wherein the switch is to couple the digital waveform to at least one of a plurality of DACs in response to a selection signal.

8. The integrated circuit of claim 6, further comprising:

a switch to couple the adjustable calibration signal to the calibration path when operating in a first mode and to couple an input signal to the calibration path when operating in a second mode.

9. The integrated circuit of claim 8, wherein the switch is a multiplexer.

10. The integrated circuit of claim 8, wherein the switch is coupled to an input of the device in the calibration path.

11. The integrated circuit of claim 6, wherein the device includes a sampler, the parameter includes a correction for a DC offset of the sampler, and the correction corresponds to an output signal of approximately zero.

12. The integrated circuit of claim 6, wherein the device includes a sampler, and the parameter includes a correction to a voltage threshold of the sampler.

13. A receiver calibration system, comprising:

a switch coupled to receive an input signal and an adjustable calibration signal, wherein the adjustable calibration signal is a DC reference voltage;

a sampler coupled to the switch, wherein the sampler is to receive the input signal or the adjustable calibration signal from the switch and provide an output signal;

a signal generator, comprising an oversampled digital-to-analog converter (DAC) to provide the adjustable calibration signal to the switch based on a calibration control signal;

a controller coupled to the signal generator and the sampler, the controller is to provide the calibration control signal in response to the sampler output signal; and an offset cancellation circuit coupled to the controller and the sampler, the offset cancellation circuit is to adjust an input sampling parameter in the sampler based on an adjustment signal from the controller.

14. The receiver calibration system of claim 13, wherein the controller is a finite state machine.

15. The receiver calibration system of claim 13, wherein the offset cancellation circuit is a digital-to-analog converter (DAC).

16. The receiver calibration system of claim 13, wherein the switch is disposed in a pre-amplifier in the receiver calibration system.

17. A receiver calibration system, comprising:

a switch coupled to receive an input signal and an adjustable calibration signal;

a sampler coupled to the switch, wherein the sampler is to receive the input signal or the adjustable calibration signal from the switch and provide an output signal;

a signal generator, comprising an oversampled n-bit digital-to-analog converter (DAC) to provide the adjustable calibration signal to the switch based on a calibration control signal, wherein the adjustable calibration signal is a DC reference voltage;

a controller coupled to the signal generator and the sampler, the controller is to provide the calibration control signal in response to the sampler output signal;

wherein the oversampled n-bit DAC, comprises:

a digital pulse width modulator (PWM) to generate a digital waveform; and the oversampled n-bit DAC provides an analog calibration signal in accordance with the digital waveform, wherein the adjustable calibration signal is derived from the analog calibration signal.

18. The receiver calibration system of claim 17, wherein the oversampled n-bit DAC, further comprises:

an analog filter coupled to the n-bit DAC for providing a filtered analog calibration signal.

19. The receiver calibration system of claim 18, wherein the analog filter is a low pass filter.

20. The receiver calibration system of claim 19, wherein the low pass filter is a resistor-capacitor (RC) filter.

21. A receiver calibration system, comprising:

a switch, disposed in a pre-amplifier, coupled to receive an input signal and a calibration signal;

a sampler coupled to the switch and configurable to receive the input signal or the calibration signal from the switch and provide an output;

a signal generator configurable to provide the calibration signal to the switch based on a calibration control signal;

a controller coupled to the signal generator and an output of the sampler, the controller configurable to provide the calibration control signal in response to the sampler output;

wherein the input signal is a differential input signal and the pre-amplifier, comprises:
a first differential pair;
a first current source;
a second differential pair;
a second current source; and
a first switch configurable to couple the first differential pair to the first current source so as to couple the differential input signal to the sampler; and
a second switch configurable to couple the second differential pair to the second current source so as to couple the calibration signal to the sampler.

22. The receiver calibration system of claim 21, wherein the sampler is an adaptive sampler.

23. A system, comprising:
a transmitting device coupled to a receiving device by a communication link;
the transmitting device including:
a signal generator to generate an adjustable calibration input signal based on a calibration control signal, wherein the signal generator includes an oversampled digital-to-analog converter (DAC), and wherein the adjustable calibration input signal is a DC reference voltage;
a transmitter coupled to the signal generator, wherein the transmitter is to transmit a calibration output signal to the receiver; and
a controller; and
the receiving device including a sampler coupled to the transmitter via the communication link, wherein the sampler is to sample the calibration output signal; and
wherein the controller is coupled to the sampler via the communication link and is to generate the calibration control signal based on an output of the sampler.

24. The system of claim 23, further comprising:
an offset cancellation circuit coupled to the sampler, wherein the offset cancellation circuit is to adjust a parameter in the sampler based on an adjustment signal.

25. The system of claim 24, wherein the offset cancellation circuit is a digital-to-analog converter (DAC).

26. The system of claim 23, wherein the oversampled DAC, comprises:
a digital pulse width modulator (PWM) to generate a digital waveform; and
wherein the oversampled DAC is an n-bit DAC, and wherein the oversampled DAC is to convert the digital waveform into an analog calibration signal.

27. The system of claim 26 wherein the oversampled DAC, further comprises:
an analog filter to provide a filtered analog calibration signal.

28. The system of claim 27, wherein the analog filter is a low pass filter.

29. The system of claim 28, wherein the low pass filter is a resistor-capacitor (RC) filter.

30. The system of claim 23, wherein the controller is a finite state machine.

31. A method of calibrating an integrated circuit, comprising:
providing a calibration path in the integrated circuit with an adjustable calibration signal, including:
generating a pulse width modulated digital waveform;
converting the pulse width modulated digital waveform into an analog representation of a bit stream using an oversampled digital-to-analog converter (DAC);
filtering the bit stream to extract an average signal level for the bit stream;
generating the adjustable calibration signal from the average signal level, wherein the adjustable calibration signal is a DC reference voltage; and
providing the adjustable calibration signal to the calibration path;
adjusting a parameter associated with a device in the calibration path based on a device output in response to the adjustable calibration signal; and
adjusting the adjustable calibration signal based on the device output so as to calibrate the device.

32. A system for calibrating an integrated circuit, comprising:
means for providing a calibration path in the integrated circuit with an adjustable calibration signal, wherein the adjustable calibration signal is a DC reference voltage;
means for adjusting a parameter associated with a device in the calibration path based on a device output in response to the adjustable calibration signal; and
means for adjusting the adjustable calibration signal based on the device output so as to calibrate the device;
wherein the means for providing a calibration path in the integrated circuit with the adjustable calibration signal comprises:
means for generating a pulse width modulated digital waveform;
oversampled means for converting the pulse width modulated digital waveform into an analog representation of a bit stream;
means for filtering the bit stream to extract an average signal level for the bit stream;
means for generating the adjustable calibration signal from the average signal level; and
means for providing the adjustable calibration signal to the calibration path.

33. A computer readable medium containing data representing a circuit that includes:
a calibration path including a device;
a signal generator coupled to the calibration path to provide the calibration path with an adjustable calibration signal, wherein the adjustable calibration signal is a DC reference voltage; and
a controller coupled to the signal generator and the calibration path, the controller is to adjust the signal generator and a parameter associated with the device in the calibration path in response to an output signal provided by the circuit so as to calibrate the device in the calibration path;
wherein the signal generator comprises an oversampled digital-to-analog converter that includes:
a digital pulse width modulator (PWM) to generate a digital waveform; and
an digital-to-analog converter coupled to the PWM for converting the digital waveform into the adjustable calibration signal.

* * * * *